United States Patent

Huq

[11] Patent Number: 5,859,630
[45] Date of Patent: Jan. 12, 1999

[54] BI-DIRECTIONAL SHIFT REGISTER

[75] Inventor: Ruquiya Ismat Ara Huq, Plainsboro, N.J.

[73] Assignee: Thomson multimedia S.A., Courbevoie, France

[21] Appl. No.: 761,918

[22] Filed: Dec. 9, 1996

[51] Int. Cl.$^6$ ..................................................... G09G 3/36
[52] U.S. Cl. ................................ 345/100; 377/69; 377/78
[58] Field of Search ........................... 345/98, 100, 197; 377/69, 78

[56] References Cited

U.S. PATENT DOCUMENTS

| | | | |
|---|---|---|---|
| 4,499,459 | 2/1985 | Sasaki et al. | 340/752 |
| 4,917,468 | 4/1990 | Matsuhashi et al. | 350/332 |
| 5,410,583 | 4/1995 | Weisbrod et al. | 377/75 |

Primary Examiner—Matthew Luu
Attorney, Agent, or Firm—Joseph S. Tripoli; Joseph J. Laks; Sammy S. Henig

[57] ABSTRACT

A bi-directional shift register for scanning a liquid crystal display includes cascaded stages. A given stage includes an output transistor having a clock signal coupled thereto. A first input section is responsive to an output pulse of a second stage for generating a control signal that is coupled to the transistor to condition the output transistor periodically for operation in a conduction state when shifting in a first direction is selected. The input section is responsive to an output pulse of a third stage for periodically conditioning the output transistor to operate in the conduction state, when shifting in the opposite direction is selected. When the clock signal occurs and the transistor is conditioned for the operation in the conduction state, an output pulse is generated at an output of the given stage. A second input section is responsive to a corresponding output pulse of a corresponding stage for varying the control signal to condition periodically the output transistor for operation in a non-conductive state to disable the generation of the given stage output pulse, when the clock signal occurs.

17 Claims, 3 Drawing Sheets

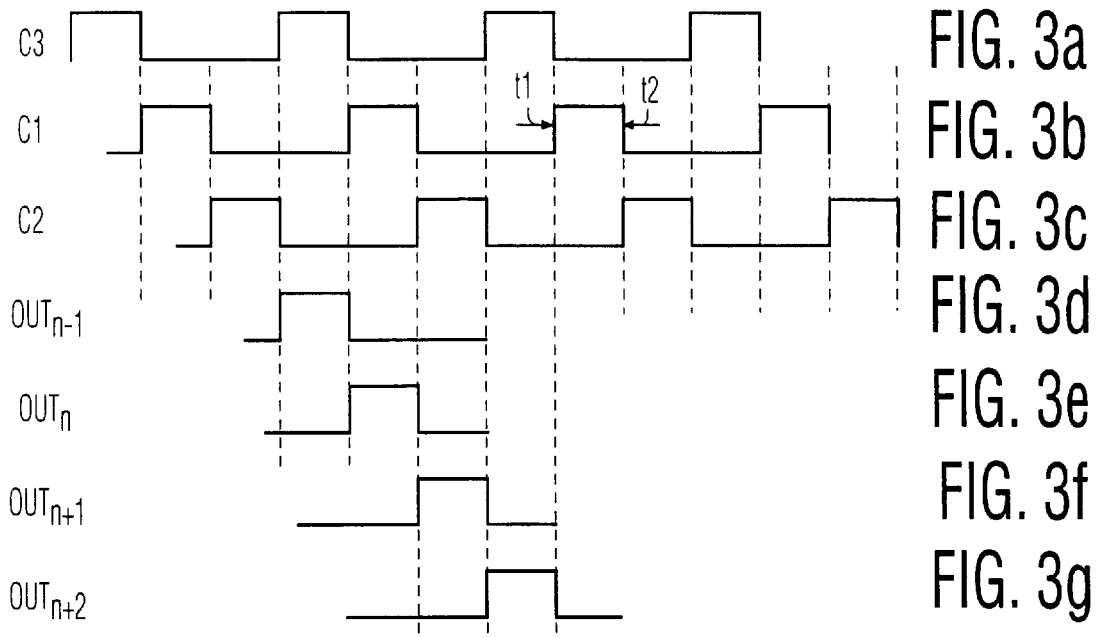
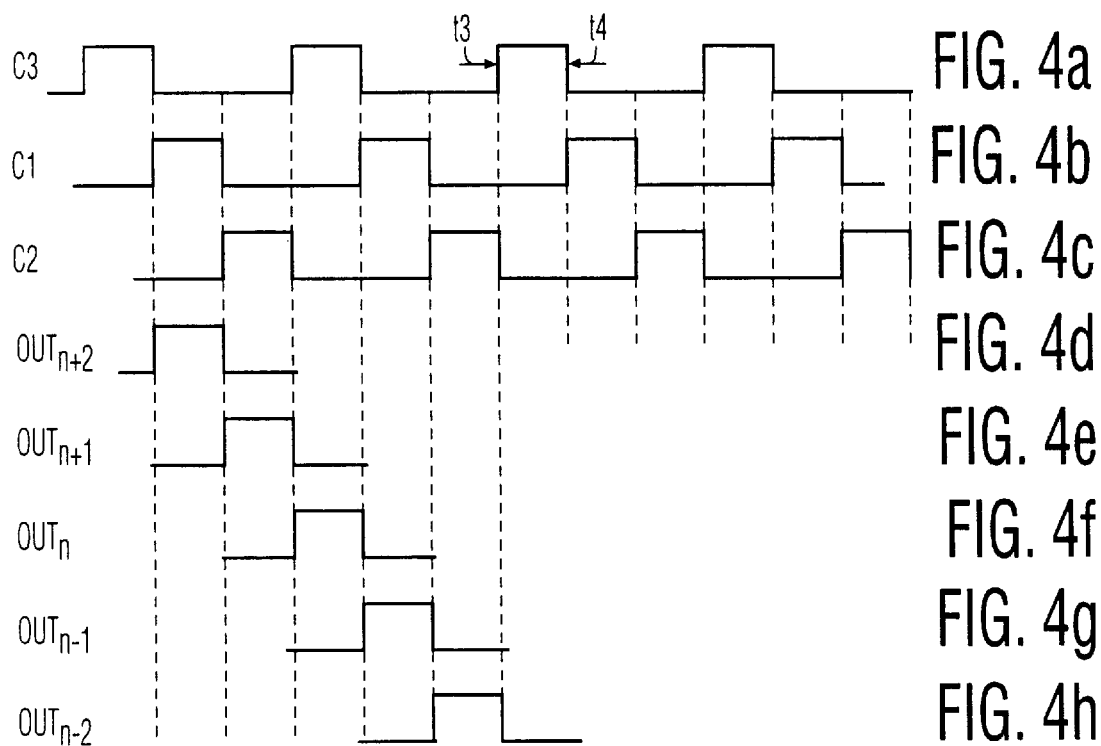

BI-DIRECTIONAL SHIFT REGISTER

This invention relates generally to drive circuits for display devices and particularly to a bi-directional shift register for applying row select line signals to row select lines in a liquid crystal display (LCD).

Display devices, such as liquid crystal displays, are composed of a matrix or an array of pixels arranged horizontally in rows and vertically in columns. The video information to be displayed is applied as brightness (gray scale) signals to data lines which are individually associated with each column of pixels. The rows of pixels are sequentially scanned by signals that are developed in row select lines. The capacitance of the pixel associated with the activated row select line is charged to the various brightness levels in accordance with the level of the brightness signal applied to the individual columns via the corresponding data lines.

Amorphous silicon has been the preferable technology for fabricating liquid crystal displays because this material can be fabricated at low temperatures. Low fabrication temperature is important because it permits the use of standard, readily available and inexpensive substrate materials. However, the use of amorphous silicon thin film transistors (a—Si TFTs) in integrated peripheral pixel drivers causes design difficulties because of low mobility, threshold voltage drift and the availability of only N-type metal oxide semiconductor (N-MOS) enhancement transistors. The threshold voltage of the TFT increases permanently by an amount that varies in direct relation to the magnitude of the applied gate-source voltage. The larger the gate-source voltage and the longer the time it is applied, the greater is the permanent increase in the threshold voltage. Thus, the magnitude of the gate-source voltage and its duration exhibit stress to which the TFT is subjected.

An example of a known scan or shift register that drives the row select lines is described in U.S. Pat. No. 5,410,583, in the name of Weisbrod, et al., which may be coupled to an array of a liquid crystal display device. The Weisbrod et al., shift register includes cascaded stages. An output section of a given stage of the register is arranged as a push-pull amplifier that may be formed by TFT's. When a given row is de-selected, a pull-down TFT of the push-pull amplifier is turned on for applying a suitable impedance at a terminal of a row line conductor of the de-selected row. When the given row is selected, a pull-up transistor is turned on for producing an output pulse of the given stage.

A further transistor that is responsive to an output pulse of a stage downstream of the given stage is coupled to a control terminal of the pull-down transistor for developing a control voltage. The control voltage may be slightly larger than the threshold voltage of the pull-down transistor. Thereby, advantageously, stress in the pull-down transistor is reduced. Stress tends to produce a threshold voltage drift in the TFT's. The further transistor operates at a low duty cycle. Therefore, advantageously, it is also subject to a reduced stress.

The array of pixels may be equipped with terminals or pins for connecting the row select lines of the array to the shift register. For a given array, the pins may be organized in a predetermined successive order. For example, the pin associated with the row select line at the top of the pixel array may be placed at one end of a group of conductors; whereas, the pin associated with the row select line at the bottom of the pixel array may be placed at the other end. Similarly, the integrated circuit (IC) that contains the shift register may be equipped with terminals or pins for connecting the row select line drivers to the pins of the array. The pins of the shift register IC may be also organized in a similar successive order. The pins of the shift register IC and those of the row select lines are coupled to each other, respectively. The required direction of shifting in the shift register depends on the order of the pins of the array relative to the order of the pins of the shift register IC.

To obtain versatility, it may be desirable to use the same IC when shifting in a first direction is desired and when shifting in an opposite direction is desired. For example, in some projection display applications that includes three LCD arrays for displaying the three primary colors, one array of pixels may be scanned from the bottom to the top of the display. Whereas, the other two arrays may be scanned in the conventional manner, from the top to the bottom of the display. Thus, it may be desirable to make the shift register bi-directional. It may be further desirable to obtained the bi-directional feature without adding excessive circuitry. It may also be desirable to operate the TFT's of the bi-directional shift register with reduced stress.

A bi-directional shift register, embodying an aspect of the invention, includes a source of a plurality of phase shifted clock signals having a first phase relationship therebetween, when a first direction of shifting is selected, and having a second phase relationship therebetween, when an opposite direction of shifting is selected. A plurality of cascaded stages are coupled to the source of the clock signals. A given stage of the cascaded stages includes a first output transistor for generating an output pulse at an output of the given stage, when, during a corresponding clock signal associated with the given stage, the transistor is enabled. When the first output transistor is disabled, during the associated clock signal, the first output transistor prevents the generation of the output pulse of the given stage. A first input section is responsive to a corresponding output pulse generated in each one of second and third stages for enabling the first output transistor when each of the second stage and third stage output pulses occurs. When the first phase relationship is selected, the given stage output pulse occurs following the second stage output pulse. When the second phase relationship is selected, the given stage output pulse occurs following the third stage output pulse. A second input section responsive to a corresponding output pulse generated in a corresponding stage for disabling the first output transistor after the given stage output pulse has occurred.

Figure 1:
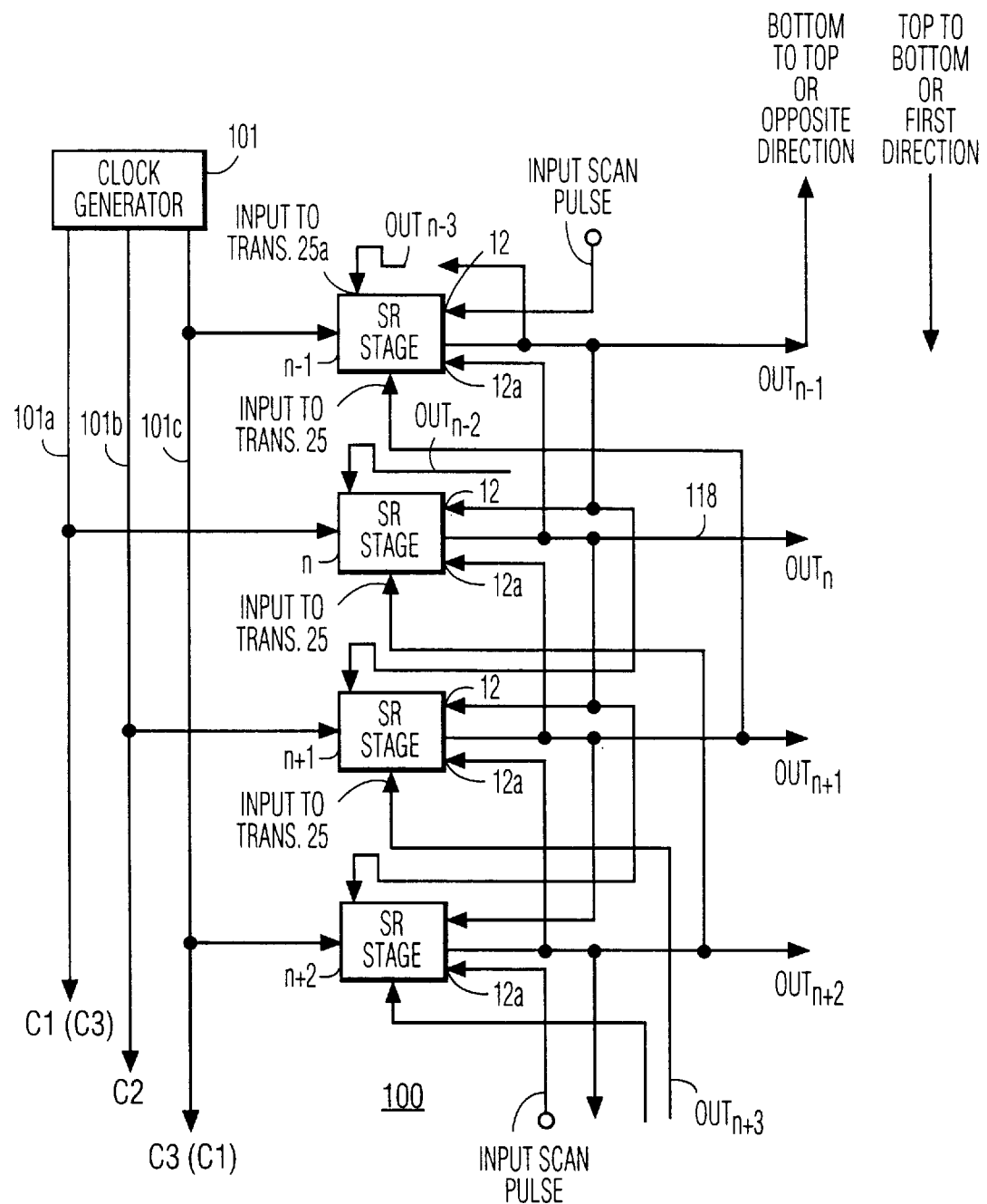
FIG. 1 illustrates a block diagram of a shift register including a plurality of cascaded stages.
Figure 2:
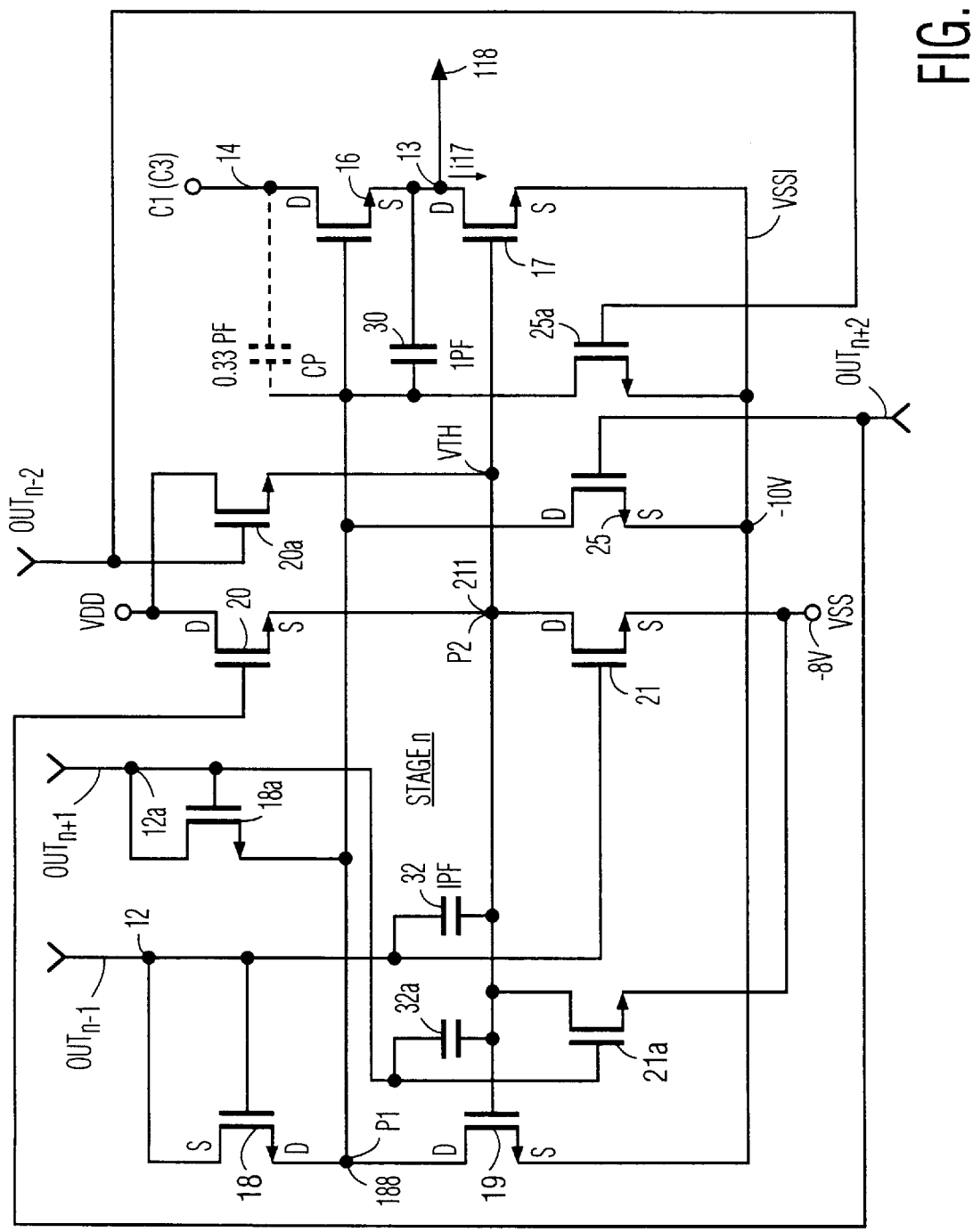
FIG. 2 illustrates a schematic diagram of a shift register stage, embodying an aspect of the invention, that can be used in the shift register of FIG. 1.

FIGS. 3a–3g are diagrams of the relative timing of the output signals and the respective clock signals occurring at respective nodes of the FIG. 1 shift register utilizing stages illustrated in FIG. 2 when the shift register performs the shifting operation in one direction; and FIGS. 4a–4h are diagrams of the relative timing of the output signals and the respective clock signals occurring at respective nodes of the FIG. 1 shift register utilizing stages illustrated in FIG. 2 when the shift register performs the shifting operation in an opposite direction to that shown in FIGS. 3a–3g.

FIG. 2 illustrates an exemplary stage n, of a shift register 100 of FIG. 1. Shift register 100 of FIG. 1 drives row select lines 118 of a liquid crystal display matrix, not shown. A clock generator 101 produces a three-phase clock signal, (clock signals C1, C2 and C3) that control shift register 100.

In shift register 100, stages n−1, n, n+1 and n+2 are coupled to one another in a cascade configuration. An output pulse signal of a given stage is coupled to an input of the immediately following stage in the chain. For example, an output pulse signal $OUT_{n-1}$ of stage n−1 in the chain of register 100 is coupled to an input terminal 12 of stage n of FIG. 2 for shifting in a first direction. The first direction is referred to herein as the top-to-bottom direction because it can provide for top-to-bottom scanning in a vertical direction. Similarly, an output pulse signal $OUT_{n+1}$ of stage n+1 in the chain of register 100 is coupled to an input terminal 12a of stage n for shifting in the opposite direction, referred to herein as the bottom-to-top direction. Illustratively, only four stages, n−1, n, n+1 and n+2 are shown. However, the total number of stages n in the chain of register 100 is substantially larger.

FIGS. 3a–3g are waveform diagrams of the relative timing of the output signals and the respective clock signals occurring at respective nodes of the FIG. 1 shift register utilizing stages illustrated in FIG. 2 when shifting in a first direction in the shift register is selected, referred to as the top-to-bottom selection mode. FIGS. 4a–4h are waveform diagrams of the relative timing of the output signals and the respective clock signals occurring at respective nodes of the FIG. 1 shift register utilizing stages illustrated in FIG. 2 when shifting in the opposite direction in the shift register is selected, referred to herein as the bottom-to-top selection mode. Similar symbols and numerals in FIGS. 1, 2, 3a–3g and 4a–4h indicate similar items or functions.

Shift register 100 of FIG. 1 may be referred to as a "walking one" shift register. This means a TRUE state propagates through register 100 during a video frame time. The clock signals C1, C2 and C3 determine whether the TRUE state propogates through in an ascending order or a descending order of stages n of register 100. When the TRUE state propagates through the ascending order of stages n, referred to as shifting in the first direction, as shown in FIGS. 3d–3g, the rows of the display (not shown) may be successively selected in the direction from the top to the bottom of the display, referred to herein as top-to-bottom row selection mode. Whereas, when the TRUE state propagates through the descending order of stages n, referred to as shifting in an opposite direction, as shown in FIGS. 4d–4h, the rows of the display, not shown, may be successively selected in the direction from the bottom to the top of the display, referred to herein as bottom-to-top row selection.

Assume that the relative phases between clock signals C1, C2 and C3 are the same in both the top-to-bottom and bottom-to-top row selection modes, as shown in FIGS. 3a–3c and 4a4c, respectively. In the top-to-bottom row selection mode, clock signal C1 is developed on a conductor 101a of register 100 of FIG. 1; clock signal C2 is developed on a conductor 101b of register 100; and clock signal C3 is developed on a conductor 101c of register 100. On the other hand, in the bottom-to-top row selection mode, clock signals C1 and C3 are inter-changed with each other and are developed on conductors 101c and 101a, respectively.

In the conventional top-to-bottom row selection mode, for example, signal $OUT_{n-1}$ of FIG. 1 is developed at input terminal 12 of stage n of FIG. 2. Signal $OUT_{n-1}$ at the HIGH level is coupled via a transistor 18 of FIG. 2 operating as a switch to a terminal 188 for developing a control signal P1. The pulse of signal $OUT_{n+1}$ of FIG. 3d occurs coincidentally with clock signal C3. Signal $OUT_{n-1}$ of stage n−1 that is coupled to input terminal 12 of stage n is also coupled to the gate electrode of a transistor 21. A drain of transistor 21 is coupled via a terminal 211 to a gate of a transistor 19 and to the gate electrode of a pull-down transistor 17. As a result, transistor 21 is placed into conduction which renders both transistors 19 and 17 nonconductive.

The HIGH or TRUE level of signal P1 is temporarily stored in an inter-electrode capacitance, CP, and in a bootstrap capacitor 30. Signal P1 that is developed at the gate of an output transistor 16 conditions output transistor 16 for conduction. Clock signal C1 of FIG. 3b is coupled via transistor 16 to an output terminal 13 when terminal 188 is high. Clock signal C1 that is coupled via an inter-electrode parasitic capacitance CP to bootstrapping capacitor 30, developed at the gate of transistor 16, tends to bootstrap the potential at terminal 188 for providing extra drive to transistor 16. Consequently, an output pulse signal $OUT_n$ is developed at the output terminal 13 of register n. During output pulse signal $OUT_n$, pull-down transistor 17 is rendered non-conductive by the operation of transistor 21 and has no effect then on signal $OUT_n$.

Signal $OUT_n$ of stage n is applied to an input terminal of subsequent stage n+1 of FIG. 1. Stage n+1 operates similarly to stage n except for utilizing clock signal C2, instead of clock signal C1 in stage n, for turning on the corresponding transistor. When clock signal C1 attains the inactive LOW level, transistor 16 remains turned on until signal P1 goes low. Signal $OUT_n$ of stage n goes low by virtue of discharge through transistor 16 when clock signal C1 is low.

A transistor 25 has its drain-source conduction path coupled between terminal 188 and a reference potential VSS1 sufficient to turn off or disable pull-up transistor 16 when transistor 25 is conductive. The gate of transistor 25 of stage n is coupled to an output terminal of subsequent stage n+2 in the chain of FIG. 1 and is controlled by an output signal $OUT_{n+2}$. Signal $OUT_{n+2}$ is generated downstream of the pulse propagation path in register 100.

The pulse of signal $OUT_{n+2}$ occurs concurrently with clock signal C3 of FIG. 3a. The pulse of signal $OUT_{n+2}$ causes transistor 25 of FIG. 2 to discharge the capacitance associated with terminal 188. Transistor 25 clamps the signal at terminal 18a to a level that disables transistor 16 and prevents transistor 16 from generating any additional pulse of signal $OUT_n$ when the immediately following pulse of clock signal C1 occurs.

The pulse of signal $OUT_{n+2}$ is also coupled to a gate of a transistor 20 that is a TFT for turning on transistor 20. Transistor 20 applies a voltage VDD to terminal 211 for turning on transistors 17 and 19. Thus, transistor 20 is turned on only during the selection of one row out of, for example, 560 rows. Therefore, transistor 20 operates in a low duty cycle. Consequently, transistor 20 is not significantly stressed. The result is that threshold voltage drift of transistor 20 is reduced and its operational lifetime is increased.

Following the pulse of signal $OUT_{n+2}$, transistor 20 is turned off. However, a capacitor 32 that is coupled to the gate of transistors 17 and 19 stores a charge by the operation of transistor 20. The stored charge in capacitor 32 maintains transistors 17 and 19 conductive until the next scanning cycle, when the signal at terminal 12 causes transistor 21 to turn on and, thereby, cause transistors 17 and 19 to turn off. Capacitor 32 also provides noise filtering for the signal at terminal 12.

As long as transistor 17 is conductive, it operates as a pull-down transistor for applying a suitable impedance at terminal 13. Thus, transistor 17 sinks a current i17. Advantageously, the drain-source impedance of transistor 17 is sufficiently low to discharge the high level on the row select line and in addition it is sufficiently low to sink any parasitic currents coupled to the row select line from the column lines of the LCD matrix. If parasitic currents are not dissipated by transistor 17, they may produce potentials that grow to a magnitude sufficiently large to cause a false selection in the subsequent register stage. Thus, a false selection is prevented provided that the threshold voltage of transistor 17 does not significantly increase over the operation life. Advantageously, when transistor 19 is conductive, it prevents clock signals C1 and C3 from turning on transistor 16.

A pulse at each output terminal of register 100 of FIG. 1, for example, the pulse of signal $OUT_{n+2}$, occurs only once during a vertical interval of approximately 16.6 millisecond. Therefore, advantageously, none of the switched transistors 18, 16, 20 and 25 of stage n of FIG. 2 is biased for conduction more than one clock period, during each vertical interval.

However, transistors 17 and 19 are biased for continuous conduction, during most of the vertical interval. To reduce stress in transistors 17 and 19, signal P2 at the gate of transistor 17 is established at a voltage level that is not significantly greater than the threshold voltage of transistor 17.

In accordance with an inventive feature, clock signals C1 and C3 are inter-changed with each other, in the bottom-to-top row selection mode, relative to the situation in the top-to-bottom row selection mode. Thus, clock signal C1 is coupled, in the bottom-to-top mode, to the same stages to which clock signal C3 is coupled, in the top-to-bottom selection mode, and vice versa. Clock signal C2 is coupled to the same stages in both selection modes. Thus, clock signal C1, shown without parenthesis in FIGS. 1 and 2, is coupled, in the top-to-bottom selection mode, for example, to stage n. Whereas, in the bottom-to-top selection mode, clock signal C1, shown in parenthesis in FIGS. 1 and 2, is coupled, for example, to stages n−1 and n+2. In contrast, clock signal C3, shown without parenthesis in FIGS. 1 and 2, is coupled, in the top-to-bottom selection mode, to stages n−1 and n+2. Whereas, in the bottom-to-top selection mode, clock signal C3, shown in parenthesis in FIGS. 1 and 2, is coupled to stage n. In the bottom-to-top selection mode, instead of clock signal C1, clock signal C3, shown in parenthesis, is coupled to the drain electrode of transistor 16 of FIG. 2. Advantageously, by merely interchanging clock signals C1 and C3, register 100 of FIG. 1 is selectably adapted for either shifting in the first direction or in the opposition direction.

In the bottom-to-top row selection mode, signal $OUT_{n+1}$ of FIG. 1 is developed at input terminal 12a of stage n of FIG. 2. Signal $OUT_{n+1}$ at the HIGH level is coupled via a transistor 18a of FIG. 2, operating as a switch, to terminal 188 for developing control signal P1. Transistor 18a is analogous to transistor 18 that was referred to before. Signal $OUT_{n+1}$ of FIG. 4e occurs coincidentally with clock signal C2.

Signal $OUT_{n+1}$ of stage n+1 that is coupled to input terminal 12a of stage n of FIG. 2 is also coupled to the gate electrode of a transistor 21a. Transistor 21a is analogous to transistor 21, that was referred to before. A drain of transistor 21a is coupled via terminal 211 to the gate of transistor 19 and to the gate electrode of pull-down transistor 17. As a result, both transistors 19 and 17 are rendered non-conductive.

The HIGH or TRUE level of signal P1 is temporarily stored in the aforementioned inter-electrode capacitance CP and in capacitor 30. Signal P1 that is developed at the gate of output transistor 16 conditions output transistor 16 for conduction. Clock signal C3 of FIG. 4a is coupled via transistor 16 to output terminal 13 when terminal 188 is high. Clock signal C3 that is coupled via interelectrode parasitic capacitance CP tends to bootstrap the potential at terminal 188 for providing extra drive to transistor 16. Consequently, output pulse signal $OUT_n$ is developed at the output terminal 13 of register n. During this interval, pull-down transistor 17 is rendered non-conductive by the operation of transistor 21a and has no effect then on signal $OUT_n$.

Signal $OUT_n$ of stage n is applied to an input terminal of stage n−1 of FIG. 1. Stage n−1 operates similarly to stage n except for utilizing clock signal C1, instead of clock signal C3, in stage n, for turning on the corresponding transistor. When clock signal C3 attains the inactive LOW level, transistor 16 of stage n remains turned on until signal P1 goes low. Signal $OUT_n$ of stage n goes low by virtue of discharge through transistor 16 when clock signal C3 is low.

A transistor 25a that is analogous to transistor 25, referred to before, has its drain-source conduction path coupled between terminal 188 and a reference potential VSS1 sufficient to turn off or disable pull-up transistor 16 when transistor 25a is conductive. The gate of transistor 25a of stage n is coupled to an output terminal of stage n−2 of FIG. 1 and is controlled by an output signal $OUT_{n+2}$. Signal $OUT_{n+2}$ is generated downstream of the pulse propagation path in register 100.

The pulse of signal $OUT_{n+2}$ of FIG. 4h occurs concurrently with clock signal C2 of FIG. 4c, during interval t1−t2. The pulse of signal $OUT_{n+2}$ causes transistor 25a of FIG. 2 to discharge the aforementioned inter-electrode capacitance CP at terminal 188. Transistor 25a clamps the signal at terminal 188 to a level that disables transistor 16 for preventing transistor 16 from generating an additional pulse of signal $OUT_n$, when the immediately following pulse of clock signal C3 occurs.

The pulse of signal $OUT_{n-2}$ is also coupled to a gate of a transistor 20a that is a TFT for turning on transistor 20a. Transistor 20a is analogous to transistor 20, referred to before. Transistor 20a applies voltage VDD to terminal 211 for turning on transistors 17 and 19. Thus, transistor 20a is turned on only during the selection of one row out of, for example, 560 rows. Therefore, transistor 20a operates in a low duty cycle. Consequently, transistor 20a is not significantly stressed. The result is that threshold voltage drift of transistor 20a is reduced and its operational lifetime is increased.

Following the pulse of signal $OUT_{n-2}$, transistor 20a is turned off. However, a capacitor 32a that is coupled to the gate of transistors 17 and 19 stores a charge by the operation of transistor 20a. Capacitor 32a is analogous to capacitor 32, referred to before. The stored charge in capacitor 32a maintains transistors 17 and 19 conductive until the next scanning cycle, when the signal at terminal 12a causes transistor 21a to turn on and, thereby, transistors 17 and 19 to turn off. Capacitor 32a also provides noise filtering for the signal at terminal 12a.

In accordance with an inventive feature, the bi-directional feature of register 100 is obtained by merely interchanging clock signals C1 and C3, as explained before. It is obtained without the need for changing interconnections between the stages of register 100 or applying other control signals to each stage n. Therefore, circuit simplification is obtained.

Each pulse of signal $OUT_{n-1}$ of FIG. 3d and 3g and signal $OUT_{n+1}$ of FIG. 3f and 4e conditions transistor 16 of FIG. 2 for conduction, without distinction whether shifting in the first direction or in the opposite direction is selected. Advantageously, this feature provides design simplification. However, in the top-to-bottom selection mode, signal $OUT_{n+2}$ of FIG. 3g changes the state of conductivity of transistor 16 of FIG. 2 from the conduction state to the non-conduction or disabled state prior to the immediately following pulse of clock signal C1. The immediately following pulse of clock signal C1 occurs, during interval t1–t2 of FIG. 3b. Therefore, advantageously, signal $OUT_{n+1}$ of FIG. 3f is prevented from causing the generation of signal $OUT_n$ of FIG. 2. Similarly, in the bottom-to-top selection mode, signal $OUT_{n-2}$ of FIG. 4h changes the state of conductivity of transistor 16 of FIG. 2 from the conduction state to the non-conduction state, prior to the immediately following pulse of clock signal C3, during interval t3–t4 of FIG. 4a. Therefore, advantageously, signal $OUT_{n-1}$ of FIG. 4g is prevented from causing the generation of signal $OUT_n$ of FIG. 2.

What is claimed is:

1. A bi-directional shift register, comprising:
a source of a plurality of phase shifted clock signals having a first phase relationship therebetween, when a first direction of shifting is selected, and having a second phase relationship therebetween, when an opposite direction of shifting is selected;
a plurality of cascaded stages coupled to said source of clock signals, wherein a first stage of said cascaded stages, including:
a first output transistor for generating an output pulse at an output of said, first stage, during a corresponding clock signal associated with said first stage, said transistor is enabled; and when said first output transistor is disabled, during said associated clock signal, said first output transistor prevents the generation of said output pulse of said first stage;
a first input section responsive to a corresponding output pulse generated in each one of second and third stages for enabling said first output transistor when each of said second stage and third stage output pulses occurs, such that when said first phase relationship is selected, said first stage output pulse occurs following said second stage output pulse, and, when said second phase relationship is selected, said first stage output pulse occurs following said third stage output pulse; and
a second input section responsive to a corresponding output pulse generated in a corresponding stage for disabling said first output transistor after said first stage output pulse has occurred.

2. A shift register according to claim 1, further comprising a second output transistor coupled to said first output transistor in a push-pull manner for developing a low output impedance at said first stage output when said first output transistor is disabled.

3. A shift register according to claim 1 wherein said second input section is responsive to an output pulse of a fourth stage for disabling said first output transistor following said third stage output pulse, when said first shifting direction is selected, and wherein said second input section is responsive to an output pulse of a fifth stage for disabling said first output transistor following said second stage output pulse, when said opposite shifting direction is selected.

4. A shift register according to claim 1 wherein said second input section comprises a third transistor responsive to an output pulse of a fourth stage and operating in a low duty cycle for disabling said first output transistor after both said first stage output pulse and said third stage output pulse have occurred, when said first shifting direction is selected.

5. A shift register according to claim 4 wherein said second input section further comprises a fourth transistor responsive to an output pulse of a fourth stage and operating in a low duty cycle for disabling said first output transistor after both said first stage output pulse and said second stage output pulse have occurred, when said opposite shifting direction is selected.

6. A shift register according to claim 1 wherein said first input section comprises a switch for storing a charge in a capacitance associated with a control terminal of said first output transistor when the corresponding output pulse of each of said second and third stages occurs to enable said first output transistor and wherein said clock signal is developed at a main current conducting terminal of said first output transistor for generating said first stage output pulse in a bootstrap manner.

7. A shift register according to claim 1 wherein said first input section comprises a switching arrangement for coupling each of said second stage output pulse and said third stage output pulse to a control terminal of said output transistor for varying a state of a control signal developed from a charge stored in a capacitance associated with said control terminal of said first output transistor to enable said first output transistor.

8. A shift register according to claim 7 wherein said switching arrangement comprises a second transistor operating with a low duty cycle for applying said second stage output pulse to said control terminal of said output transistor and a third transistor operating with a low duty cycle for applying said third stage output pulse to said control terminal of said output transistor.

9. A shift register according to claim 1 wherein said second input section comprises a second transistor, responsive to an output pulse of a fourth stage, for disabling said output transistor, when said second phase relationship is selected, and a third transistor, responsive to an output pulse of a fifth stage, for disabling said output transistor, when said first phase relationship is selected in a manner to control the shifting direction.

10. A shift register according to claim 9 wherein each of said second and third transistors operates with a low duty cycle.

11. A shift register according to claim 9 wherein each of said second and third transistors has a corresponding main current conducting terminal coupled to a control terminal of said output transistor for disabling said first output transistor, when each of said second and third transistors is conductive.

12. A shift register according to claim 9 wherein each of said second and third transistors disables said output transistor before said associated clock signal that follows said first stage output pulse occurs.

13. A shift register according to claim 1, wherein said output transistor is conductive when enabled and nonconductive when disabled.

14. A shift register according to claim 1 wherein, when said first phase relationship is selected, said second stage is located upstream of said first stage and, when said second phase relationship is selected, said third stage is located upstream of said first stage.

15. A shift register according to claim 1 further comprising, a second output transistor coupled to said output of said first stage to form a push-pull arrangement with said first output transistor, wherein, when said first output transistor is enabled, it couples said associated clock signal to said output of said first stage to generate said output pulse of said first stage, wherein, during a first interval that occurs after an end time of said associated clock signal, said first output transistor remains turned on in a manner to develop a low output impedance at said output of said first stage and wherein, following said first interval, said first output transistor is turned off and said second output transistor is turned on in a manner to maintain said output impedance low.

16. A bi-directional shift register, comprising:

a source of a plurality of phase shifted clock signals having a first phase relationship therebetween, when shifting in a first direction is selected, and a second phase relationship therebetween, when shifting in an opposite direction is selected;

a plurality of cascaded stages coupled to said source of phase shifted clock signals, wherein a first stage of said cascaded stages, including:

a first output transistor for generating an output pulse at an output of said first stage;

second and third transistors responsive to output pulses generated at outputs of second and third stages of said cascaded stages for storing a charge in a capacitance that is coupled to a control terminal of said first output transistor when the corresponding output pulse of said second stage and of said third stage occurs to enable said first output transistor; and fourth and fifth transistors responsive to output pulses generated at outputs of fourth and fifth stages for discharging said stored charge when the corresponding output pulse of said fourth stage and of said fifth stage occurs to disable said first output transistor, said first output transistor having a first main current conducting terminal that is coupled to a clock signal associated with said first stage for generating said first stage output pulse at a second main current conducting terminal of said first output transistor, following the occurrence of said second stage output pulse and before the occurrence of said fourth stage output pulse, when said clock signals have said first phase relationship, said first output transistor generating said first stage output pulse, following the occurrence of said third stage output pulse and before the occurrence of said fifth stage output pulse, when said clock signals have said second phase relationship.

17. A shift register according to claim 16 further comprising, a second output transistor coupled to said first output transistor in a push-pull manner wherein said second output transistor is responsive to said output pulse of said second stage and to said output pulse of said third stage for disabling said second output transistor and wherein said second output transistor is responsive to said fourth stage output pulse and to said fifth stage output pulse for enabling said second output transistor.

* * * * *